United States Patent

Geroldinger

[11] Patent Number: 5,917,153
[45] Date of Patent: Jun. 29, 1999

[54] SEALING CABLE PENETRATION FOR SHIELDED CABLES

[75] Inventor: Arnold Geroldinger, Unterföhring, Germany

[73] Assignee: Jacob GmbH, Kernen, Germany

[21] Appl. No.: 08/913,670

[22] PCT Filed: Mar. 20, 1996

[86] PCT No.: PCT/EP96/01212

§ 371 Date: Sep. 11, 1997

§ 102(e) Date: Sep. 11, 1997

[87] PCT Pub. No.: WO96/30985

PCT Pub. Date: Oct. 3, 1996

[30] Foreign Application Priority Data

Mar. 24, 1997 [DE] Germany .......................... 195 10 896

[51] Int. Cl.$^6$ .................................................. H02G 15/08
[52] U.S. Cl. ........................................ 174/88 C; 174/89
[58] Field of Search .................... 174/88 C, 89, 174/35 C, 70 R, 75 C, 65 R, 84 R, 85, 655 S; 439/583, 584; 285/245, 246, 250

[56] References Cited

U.S. PATENT DOCUMENTS

| | | | |
|---|---|---|---|
| 3,315,024 | 4/1967 | Ball ........................................ | 174/75 C |
| 3,373,243 | 3/1968 | Janowiak et al. .......................... | 174/89 |
| 3,622,952 | 11/1971 | Hilbert .................................... | 439/584 |
| 3,710,005 | 1/1973 | French ...................................... | 174/89 |
| 3,883,681 | 5/1975 | Campbell ............................... | 174/65 R |
| 4,156,554 | 5/1979 | Aujla ....................................... | 439/584 |

FOREIGN PATENT DOCUMENTS

| | | |
|---|---|---|
| 15 40 027 | 1/1970 | Germany . |
| 2 309 649 | 8/1974 | Germany . |
| 27 57 653 | 6/1979 | Germany . |
| 37 37 345 | 5/1989 | Germany . |
| 92 04 291.0 | 6/1992 | Germany . |

*Primary Examiner*—Kristine Kincaid
*Assistant Examiner*—Chau N. Nguyen
*Attorney, Agent, or Firm*—Henry M. Feiereisen

[57] ABSTRACT

The RF-proof cable penetration having a seal (9) for shielded cables, having a tubular threaded stub (7) which is to be inserted into a bore, and a locking nut (10) which is to be tightened onto the threaded stub, and having an annular clamping disk (8) which is forced, by a pinch seal (9) which is to be pressed on by the locking nut (10), against an annular shoulder on the threaded stub (7), is equipped according to the invention with a shielding sleeve (4) which has at least one radially projecting shoulder (6) at the front of the inner end. Furthermore, a stamping sleeve (5) is present which is to be pushed over the shielding sleeve (4) on the outside of the cable shield (3). In order to ensure a certain axial displaceability of the cable during mounting, the preassembled cable, provided with shielding sleeve (4) and mounted stamping sleeve (5), can be displaced axially relative to the threaded stub (7) owing to the fact that an annular shoulder has a continuous axial recess (12) in the interior of the threaded stub (7).

By contrast with known EMC-capable cable threaded unions, the invention has the advantage that during the process of working the cable "fraying" of the shielding braid (3) is impossible on the cable, and parts of the shielding braid cannot break off, because co-rotation of the cable during tightening is prevented by latching the shielding sleeve (4) in the interior of the threaded stub (7). The time for mounting the cable can be substantially reduced.

5 Claims, 4 Drawing Sheets

A-A

SEALING CABLE PENETRATION FOR SHIELDED CABLES

CROSS REFERENCES TO RELATED APPLICATIONS

This application is the national part of application PCT/EP96/01212 filed Mar. 20, 1996 which in turn is based on German application 195 10 895.5 filed Mar. 24, 1995.

BACKGROUND OF THE INVENTION

The invention relates to a sealing cable penetration for shielded cables, having a threaded stub which is to be inserted into a housing wall bore, a locking nut which is to be tightened onto a thread of the threaded stub which is on the outside of the housing wall, and an annular clamping disk which can be axially displaced in the interior of the threaded stub and is forced, by a pinch seal which is to be pressed on by the locking nut, against a radially inwardly projecting annular shoulder on the threaded stub.

RF-proof, that is to say EMC-capable, cable penetrations, to be sealed by screwing, for shielded cables are known in which after removal of an outer cable sheath a shielding braid is exposed which surrounds the cable and is to be connected electrically to the housing of the cable penetration and/or to the inner wall of the housing and to a frame or the like. It is possible to achieve a desired contact of the shield which conducts well and is RF-proof by using an annular clamping disk which is seated over the shield and is pressed, for example via an annular pinch seal made from rubber material, by screwing it onto a threaded stub penetrating the housing wall by tightening a locking nut. In this type of RF-proof fixing, fraying of the shielding braid occurs virtually regularly. This is because in the case of frequently following mounting steps, for example in the case of further plug mounting, the cable with the exposed shielding braid must be moved to and from at least once for operational reasons inside the cable threaded union. It can easily happen in this process that wire end pieces of the shielding braid break off and can cause electrical interference inside the device housing.

BRIEF DESCRIPTION OF THE INVENTION

It is therefore the object of the invention to construct a sealing cable penetration for shielded cables with a cable threaded union in such a way that, on the one hand, mounting is substantially simplified and mounting time is saved and, on the other hand, the nobility of the cable in both axial directions, for example during subsequent cable manufacture, is maintained.

In a sealing cable penetration for shielded cables of the generic type described at the beginning, this object is achieved according to the invention by a shielding sleeve which is to be inserted between the cable shield and the cable strand(s) and has at least one radially projecting shoulder at the front of the inner end of the cable shield, a stamping sleeve which is to be pushed over the shielding sleeve on the outside of the cable shield, and is shaped by being pressed onto the shielding braid, for example by means of crimping pliers, and by at least one continuous axial recess, adapted to the at least one radial shoulder of the shielding sleeve, in the annular shoulder of the threaded stub.

The radially projecting shoulder of the shielding sleeve can preferably be constructed in pairs in the form of diametrically opposite rounded lugs, for which purpose reference is made to the exemplary embodiment described further below.

It is possible to provide on the inside of the annular shoulder, for example offset by 90° with respect to the continuous axial recess, a sunken recess which is adapted to the radial shoulder of the shielding sleeve and is intended to latch against rotation of, and improve the contact of the shielding sleeve fixed on the shielding braid of the cable by means of the stamping sleeve. The stamping sleeve advantageously is made of a soft material, for example of copper, by comparison with the material of the shielding sleeve, which material can be made for example, of brass.

Furthermore, it is advantageous for the purpose of improving the electric contact resistance inside the cable threaded union to produce the sealing pinch seal from an elastomer having embedded conductive material, for example having embedded conducting wires.

A cable penetration with a threaded union according to the invention permits adequate freedom of movement of a prefabricated cable both inward, that is to say inside a housing, and outward, the existing shielding braid remaining connected to the threaded stub in an RF-proof fashion and without fraying. The feared fraying of the shielding braid is impossible during the entire process of working the cable because of the type, according to the invention, of mechanical and electric connection of the cable shield. Short circuits possibly occurring later or other problems due to broken-off parts of the shielding braid are also excluded. The prefabricated cable, provided with shielding sleeve and stamping sleeve, can be drawn through the threaded stub in a specific angular position, the projecting shoulder or the radially opposite lug shoulders sliding through, respectively, the provided axial recess or the radially opposite axial recesses in the annular shoulder of the threaded stub. In this case, a strand length, previously stripped of insulation, of the cable can be kept to a minimum, as a result of which it is possible during mounting to save an additional cable length of, for example, 40 to 80 mm per electrical unit to be mounted. Blocking the shielding sleeve inside the threaded stub by latching the projecting shoulder and the diametrically opposite lug-shaped shoulders in the adapted, sunken recesses on the inside of the annular shoulder of the threaded stub prevents the cable from being able to corotate when the locking nut is tightened, thus reliably preventing shielding braid wires which overhang at the end from breaking off as feared.

BRIEF DESCRIPTION OF THE SEVERAL VIEWS OF THE DRAWINGS

The invention and advantageous details are explained in more detail below with reference to the drawing and in an exemplary embodiment.

DETAILED DESCRIPTION OF THE INVENTION

Parts which correspond to one another are marked in all the figures with the same reference symbols.

Figure 1:
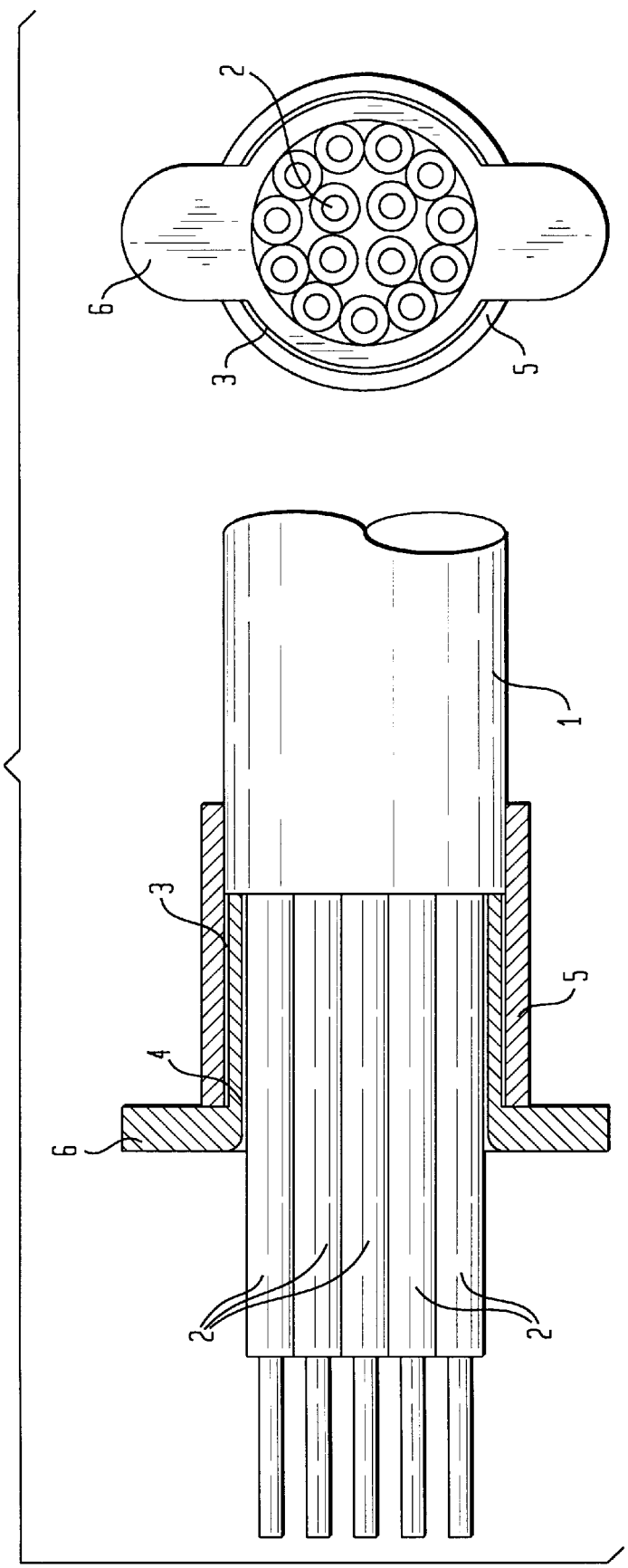
FIG. 1 shows a modified prefabricated cable end with shielding sleeve and stamping sleeve according to the invention.

FIG. 1 shows a cable 1 whose cable sheath is partially removed, with the result that cable strands 2 projecting therefrom are exposed. A shielding braid 3, which is situated directly under the cable sheath and completely surrounds the cable, likewise projects a little beyond the front of the cable sheath end. A shielding sleeve 6 has a relatively thin-tubular sheath, which is pushed under the exposed end of the shielding braid 3 in a fashion enclosing the strands 2. As the right-hand representation of the elevation in FIG. 1 shows, in the example represented the shielding sleeve 6 is provided with two diametrically opposite radial shoulders 6, which project outward approximately at right angles to the cable axis and are also shown as lug-shaped shoulders. Moreover, a stamping sleeve 5 is pushed over the shielding sleeve 6 in the region of the exposed shielding braid 3. This stamping sleeve 5 is made of a relatively soft material, such as copper, while the shielding sleeve 6 is made of a relatively harder material, for example brass.

During prefabrication of the cable end, which is stripped of insulation, the stamping sleeve 5 is firstly pushed out to the right over the exposed cable end in the left-hand picture in FIG. 1. The shielding sleeve 6 is then, as represented, pushed under the exposed shielding braid 3. Subsequently, the stamping sleeve 5 is pushed over the exposed shielding braid 3 until it strikes against the shoulders 6, and is partially shaped by means of a crimping device, for example crimping pliers, in such a way that the stamping sleeve 5 presses the exposed shielding braid 3 against the shielding sleeve 4 so that a good mechanical and electric contact is produced between the stamping sleeve 5, the exposed shielding braid 3 and the shielding sleeve 6, it being possible simultaneously still to fix the cable sheath.

Figure 4B:
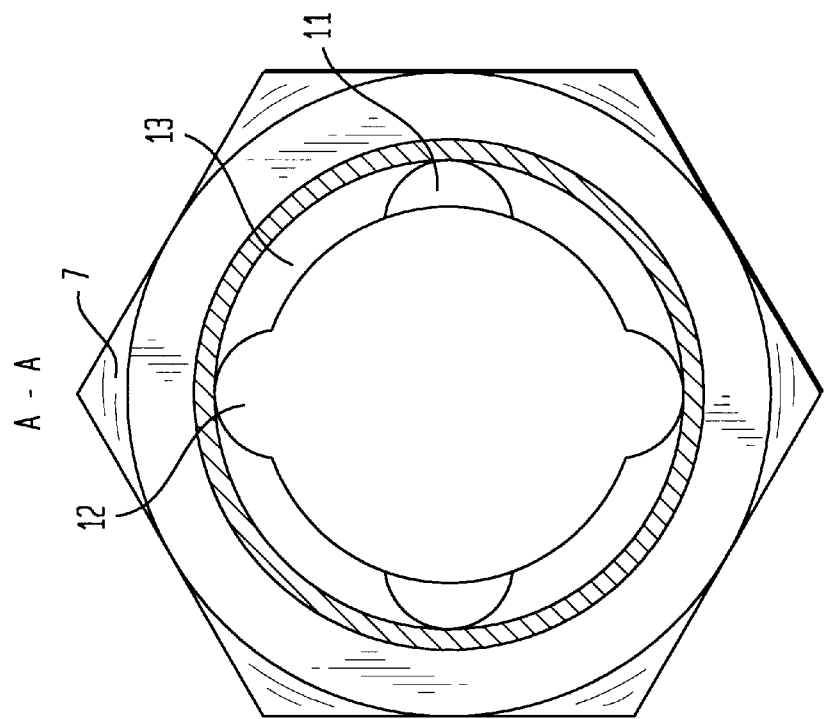
FIG. 4 shows the sectional representation of a threaded stub (right) together with a sectional elevation of the same —(left), seen in the direction of the arrows A—A.
Figure 4A:
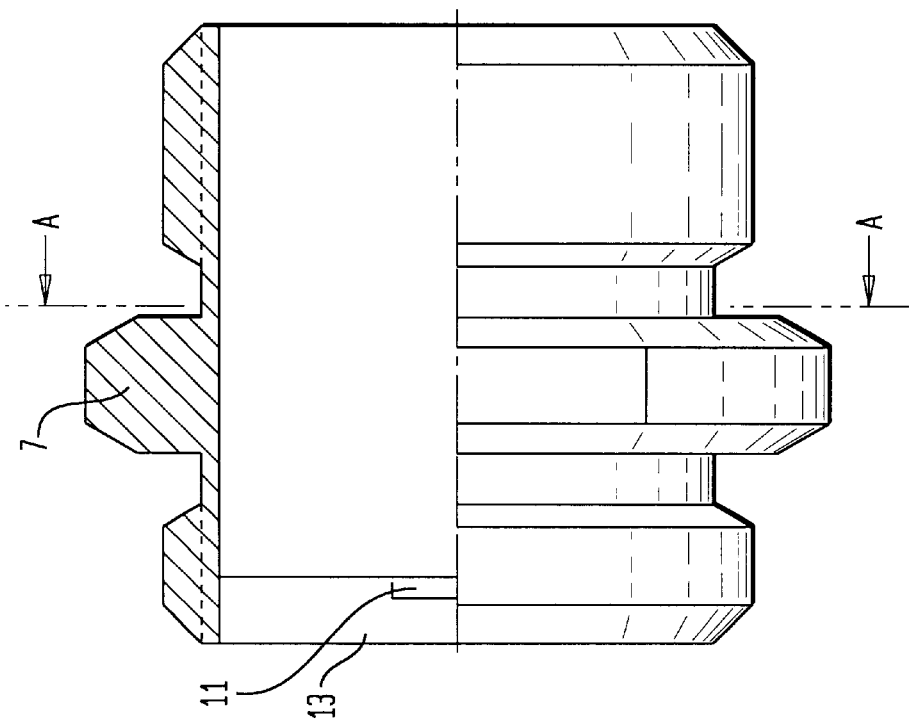

FIG. 4 illustrates the mounting of the cable penetration.

The left-hand end of a tubular threaded stub 7 is drawn, for example, into the wall of the housing of an electric device. As FIG. 4 shows, in the example represented this threaded stub 7 has at the end on the housing side an annular shoulder 13 which projects radially inward and whose inside diameter at least renders it possible for the unit composed of the strands 2 to be passed through without any problem. As may be seen from the left-hand drawing in FIG. 4, this annular shoulder 13 is provided with two diametrically opposite continuous axial recesses 12 whose contour and radial dimensions are adapted to the radial shoulders 6 of the shielding sleeve 4 in such a way that the latter can slide through the axial recesses 12 given an appropriate angular position of the prefabricated cable (compare FIG. 1), so that the prefabricated cable can be connected up in the interior of the device without any problem. If the individual strands 2 are connected inside the device, the prefabricated cable is retracted, together with the shoulders 6 reaching beyond the annular shoulder 13, into the threaded stub and rotated slightly by an angular amount, by 90° in the example represented, the shoulders 6 now latching tight in inside, sunken recesses 11 on the annular shoulder 13. It is now no longer possible for the cable to rotate.

Figure 2:
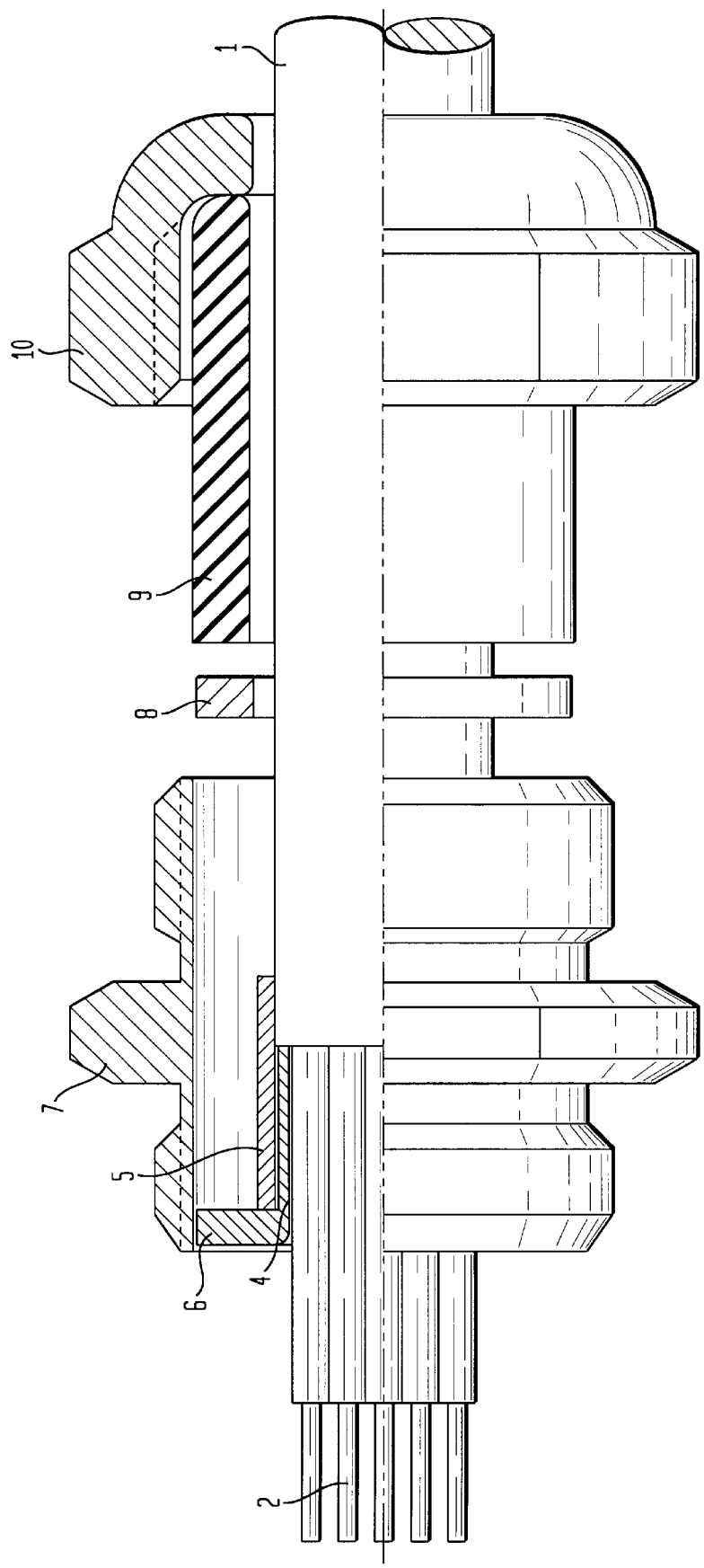
FIG. 2 shows the pulled-apart sectional representation of a sealing cable penetration according to the invention with a shielded cable threaded union.

Subsequently, (compare, once again, FIG. 2), a clamping ring 8 is pushed into the threaded stub 7 until it bears against the annular shoulder 13, and the shoulders 6 inside the sunken recesses 11 of the annular shoulder 13. A pinch seal 9 (sealing sleeve) is then pushed in and tightened by means of a locking nut 10 which is screwed onto the right-hand external thread of the threaded stub.

Figure 3:
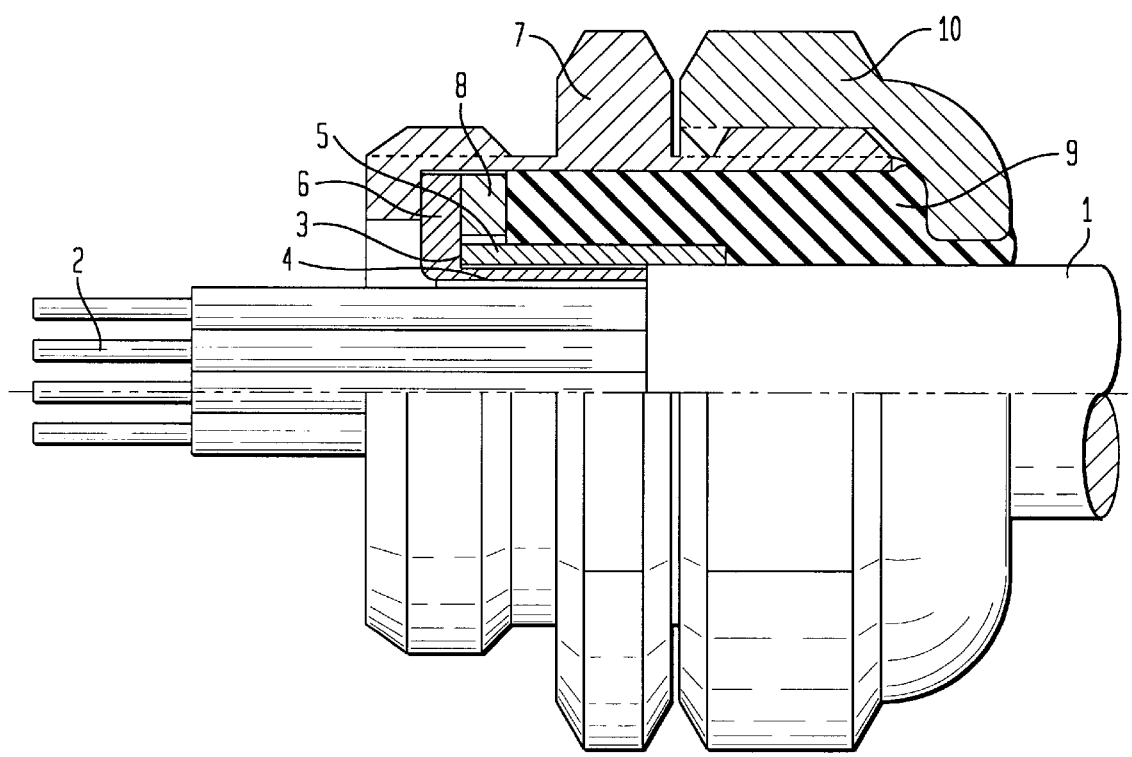
FIG. 3 shows the sectional representation of a finished sealing cable penetration with a threaded union according to the invention, which is EMC-capable.

FIG. 3 shows the completed RF-proof cable penetration and cable threaded union with the pinch seal (9) showing embedded conducting wires.

I claim:

1. A sealing cable penetration for shielded cables, comprising:

a tubular threaded stub (7) which is to be inserted into a bore of a housing wall, a locking nut (10) which is to be tightened onto a thread of the threaded stub 7 the thread being on the outside of the housing wall, and an annular clamping disk (8) which can be axially displaced in the interior of the threaded stub and is forced, by a pinch seal (9) which is to be pressed on by the locking nut (10), against a radially inwardly projecting annular shoulder (13) on the threaded stub (7), a shielding sleeve (4) which is to be inserted between a cable shield (3) and cable strands (2) and has at least one radially projecting shoulder (6) at the front end of the cable shield (3), a stamping sleeve (5) which is to be pushed over the shielding sleeve (4) on the outside of the cable shield (3), and at least one continuous axial recess (12), fitted to the at least one radial shoulder (6) of the shielding sleeve (4), in the annular shoulder (13) of the threaded stub (7).

2. A cable penetration as claimed in claim 1, which comprises at least one sunken recess (11) which is fitted to at least one radial shoulder (6) of the shielding sleeve (4), facing the cable shield (3), on the inside of the annular shoulder (13) at a position rotated with respect to the continuous radial recess (12) and is intended to latch against rotation of, and improve the contact of the shielding sleeve (4) fixed by the stamping sleeve (5).

3. A cable penetration as claimed in claim 1, wherein the stamping sleeve (5) is made of a softer material than the shielding sleeve (4).

4. A cable penetration as claimed in claim 3, wherein the stamping sleeve (5) is made of copper, and the shielding sleeve (4) is made of brass.

5. A cable penetration as claimed in claim 1, wherein for the purpose of improving the electric contact resistance, the pinch seal (9) is formed by an elastomer having embedded conducting wires.

* * * * *

UNITED STATES PATENT AND TRADEMARK OFFICE
CERTIFICATE OF CORRECTION

PATENT NO. : 5,917,153
DATED : June 29, 1999
INVENTOR(S) : Arnold Geroldinger

It is certified that error appears in the above-identified patent and that said Letters Patent is hereby corrected as shown below:

On the cover page, Item [30] and column 1,
change " Mar. 24, 1997" to --Mar. 24, 1995-- and
"195 10 896" to --195 10 896.5--

Signed and Sealed this

Twenty-eighth Day of December, 1999

Attest:

Attesting Officer

Q. TODD DICKINSON

Acting Commissioner of Patents and Trademarks